United States Patent [19]

Noble, Jr. et al.

[11] Patent Number: 5,220,956
[45] Date of Patent: Jun. 22, 1993

[54] MULTIPLE DEVICE FIXTURE USED IN CONJUNCTION WITH A STANDARD TEMPERATURE FORCING UNIT

[75] Inventors: Don E. Noble, Jr.; Sterling T. Grice, both of Odessa; Craig W. Rhodine, Midland, all of Tex.

[73] Assignee: Texas Instruments Incorporated, Dallas, Tex.

[21] Appl. No.: 825,206

[22] Filed: Jan. 24, 1992

[51] Int. Cl.⁵ .............................. H05K 7/20
[52] U.S. Cl. ...................... 165/80.2; 165/908; 361/384
[58] Field of Search .......... 165/80.3, 908, 80.2, 165/80.4; 361/384

[56] References Cited

U.S. PATENT DOCUMENTS 5,021,924  6/1991  Kieda et al. .................. 361/384 X
5,067,047  11/1991  Azar .............................. 361/384

FOREIGN PATENT DOCUMENTS 3509908  9/1986  Fed. Rep. of Germany ...... 361/384
60-136349  7/1985  Japan .................................. 165/908
1266026  10/1986  U.S.S.R. ............................ 361/384

OTHER PUBLICATIONS

"Burn-In Fixture for Modules", Brzyski et al. IBM Tech. Discl. Bul. vol. 27 No. 7B Dec. 1984.

*Primary Examiner*—Allen J. Flanigan
*Attorney, Agent, or Firm*—Ronald O. Neerings; James C. Kesterson; Richard L. Donaldson

[57] ABSTRACT

A multiple device fixture, used in conjunction with a temperature forcing unit, provides flow and direction control of conditioned air from the temperature forcing unit to two or more integrated circuits during temperature testing or characterization. The multiple device fixture provides an efficient way to temperature test multiple electronic devices simultaneously over accurately controlled temperature ranges when an automated device handler is not available, does not exist for a specific package type or is too expensive.

17 Claims, 11 Drawing Sheets

5,220,956

MULTIPLE DEVICE FIXTURE USED IN CONJUNCTION WITH A STANDARD TEMPERATURE FORCING UNIT

FIELD OF THE INVENTION

The present invention relates to the field of temperature testing of electronic circuits. More specifically, the present invention relates to a fixture, used in conjunction with a standard temperature forcing unit, that provides flow and direction control of conditioned air over two or more integrated circuits during testing or characterization.

BACKGROUND OF THE INVENTION

Integrated circuit manufacturers routinely test integrated circuits for performance and quality. Testing may be performed solely for the benefit of the manufacturer or at the request of the customer and is an expense that is figured into the cost of integrated circuits.

Customers require that the testing procedure include temperature testing. A commercial customer may require that a device be tested for performance and quality in temperature extremes from 0 degrees Celsius to 70 degrees Celsius. A military customer may demand testing in a temperature range of −55 degrees Celsius to +125 degrees Celsius. In either case, the device under test must be placed in a temperature controlled environment during testing.

Presently, there are two routinely used methods to temperature control the environment of a device during testing. In the first method, a single device is tested using a commercially available temperature forcing unit to temperature control the environment of the device. For example, the device to be tested is connected to the performance board of an IC tester. A temperature forcing unit is placed over the device to provide an environment for the device that can be temperature controlled during testing. Present test times of 10–12 minutes for each device are common place. The problem for manufacturers is the negative impact on productivity that results from such lengthy test times for single devices.

The second method uses automated device handlers. Automated device handlers provide temperature controlled environments and automated loading and unloading mechanisms for the devices to be tested. The handlers accurately distribute conditioned air over a large area to multiple devices simultaneously. Connecting cables couple the handler to the tester. Since most testers can test more than one device at the same time, it is obviously more cost effective to test multiple devices simultaneously.

The advantages of a handler are its automation and its ability to accommodate more than one device at a time in its temperature controlled chamber. The disadvantages of a handler are: first, its cost, with some handlers costing hundreds of thousands of dollars each; second, most handlers are limited to the testing of one package type; and third, handlers do not exist for certain existing and new package designs. Moreover, low product volumes may not justify the purchase of a handler. Assuming that a manufacturer has a handler for a different package device, the time and expense of converting the handler to the new device, if possible, may also be prohibitive. Thus, the options available to the manufacturer are: test one device at a time with a temperature forcing unit; buy a handler or convert one; or inform the customer that the manufacturer cannot adequately temperature test the devices.

What is needed is an efficient way to test multiple devices simultaneously over accurately controlled temperature ranges without the large capital expense associated with the purchase of an automated device handler.

SUMMARY OF THE INVENTION

A fixture, used in conjunction with a temperature forcing unit, that accurately distributes conditioned air to multiple devices simultaneously for parallel characterization and temperature testing of devices when an automated device handler is not affordable, is not available, or does not exist for a specific package type.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

Figure 1:
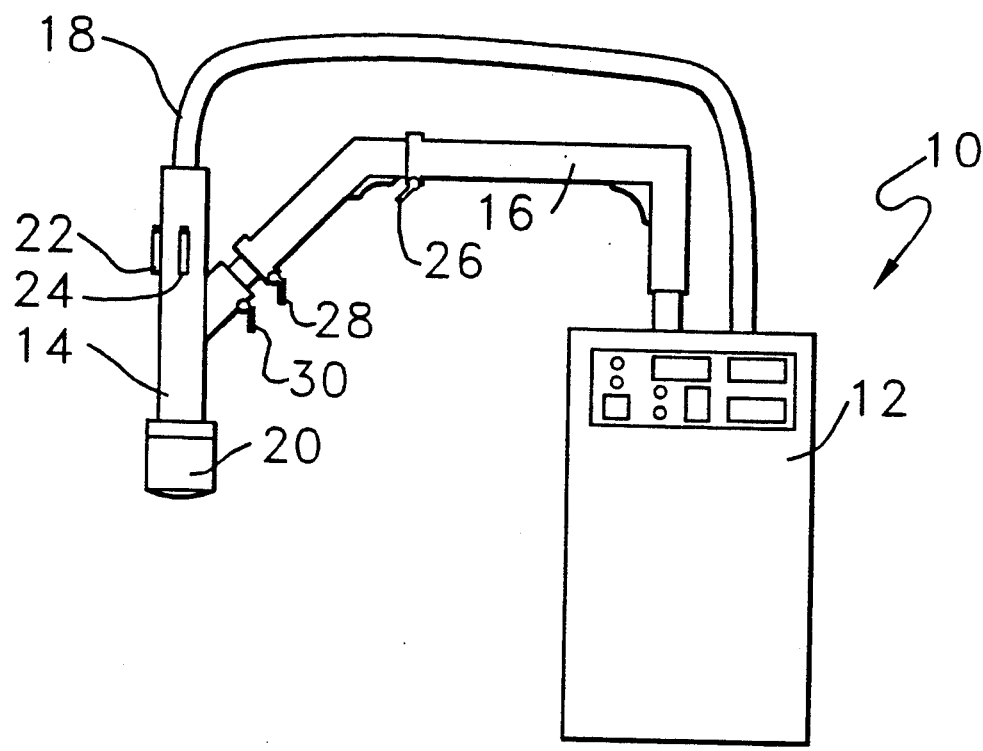
FIG. 1 is an elevational view of a temperature forcing unit.

FIG. 1 shows a temperature forcing unit, generally at 10, manufactured by the Thermonics corporation which provides a temperature controlled environment for one device. Temperature forcing unit 10 includes control and temperature generation unit 12, temperature control tube 14, support arm 16, airflow tube 18 and single device fixture 20.

Temperature control tube 14 has fixture 20 at one end which provides a chamber for a device to be tested. Control tube 14 further has wiring (not shown) that runs from the control tube, through support arm 16 to control and temperature generation unit 12, for the heating elements (not shown) in the control tube and for up and down motion control (not shown) of the control tube which is activated by control and temperature unit 12 or manually by buttons on the tops of handles 22 and 24. The up and down motion is pneumatically controlled. Support arm 16 provides alignment controls at 26, 28 and 30. Air flow tube 18 ducts cold air from control and temperature generation unit 12 to temperature control tube 14. Heated air is provided by the heaters within temperature control tube 14. Control and temperature generation unit 12 controls the volume and temperature of conditioned air that exits temperature control tube 14.

Figure 3:
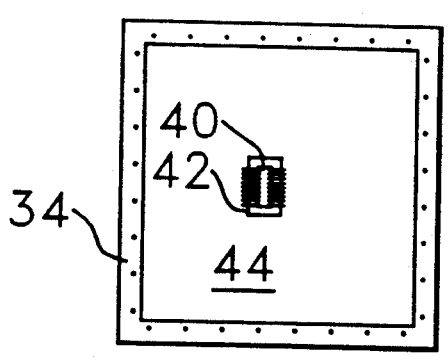
FIG. 3 is a top plan view of a performance board, having a single test site, attached to a test head.
Figure 5:
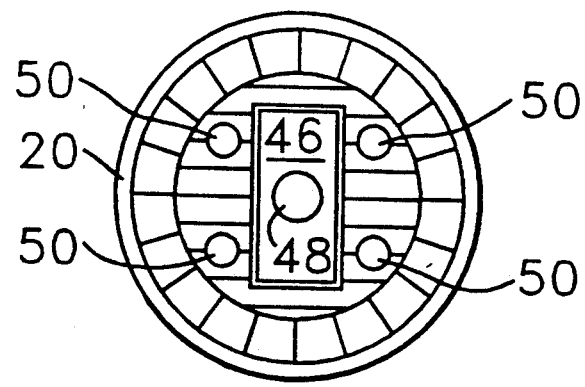
FIG. 5 is a bottom plan view of a single device testing chamber attached to a temperature forcing unit.
Figure 2:
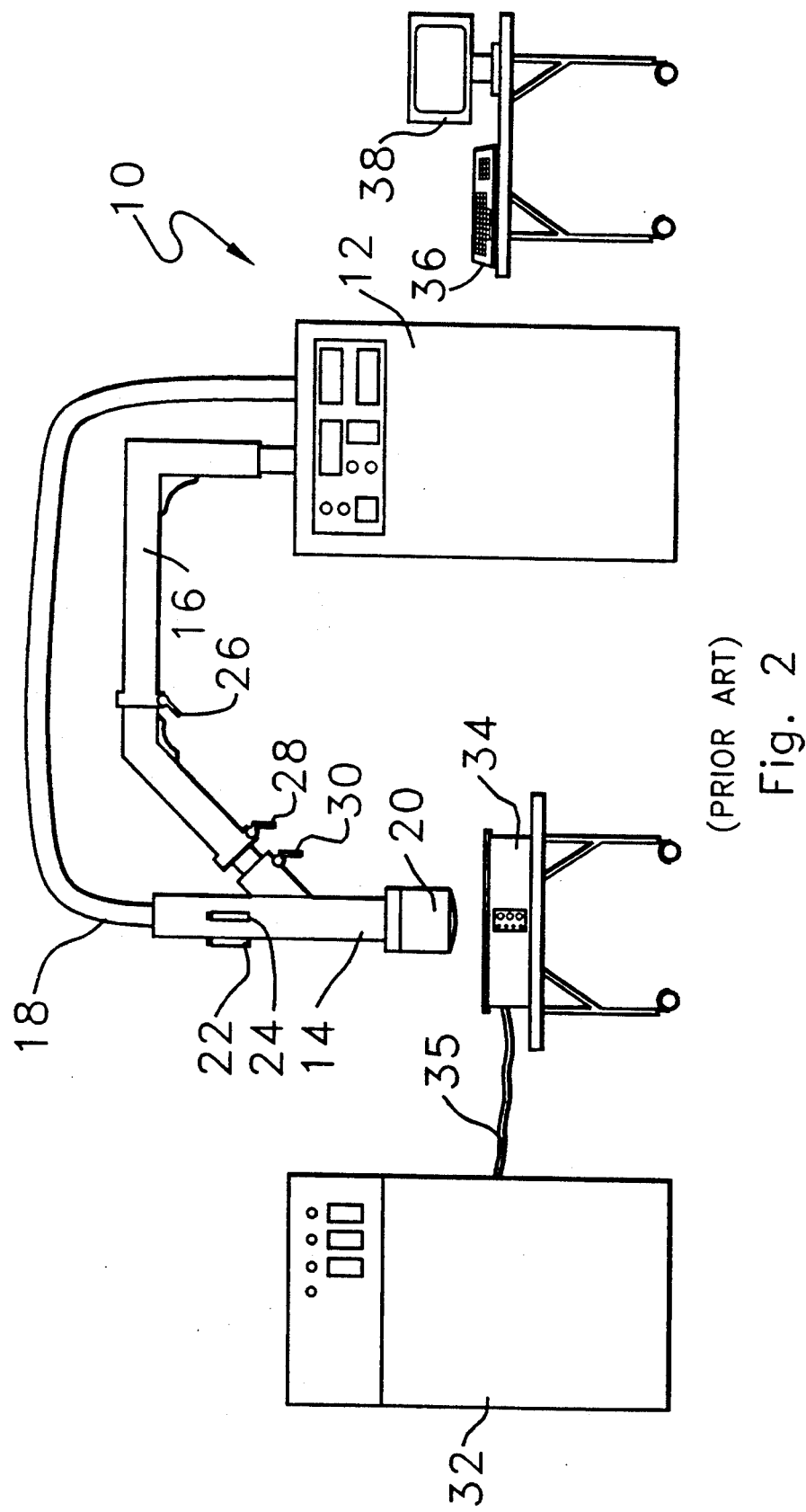
FIG. 2 is an elevational view of a temperature forcing unit and device tester.
Figure 4:
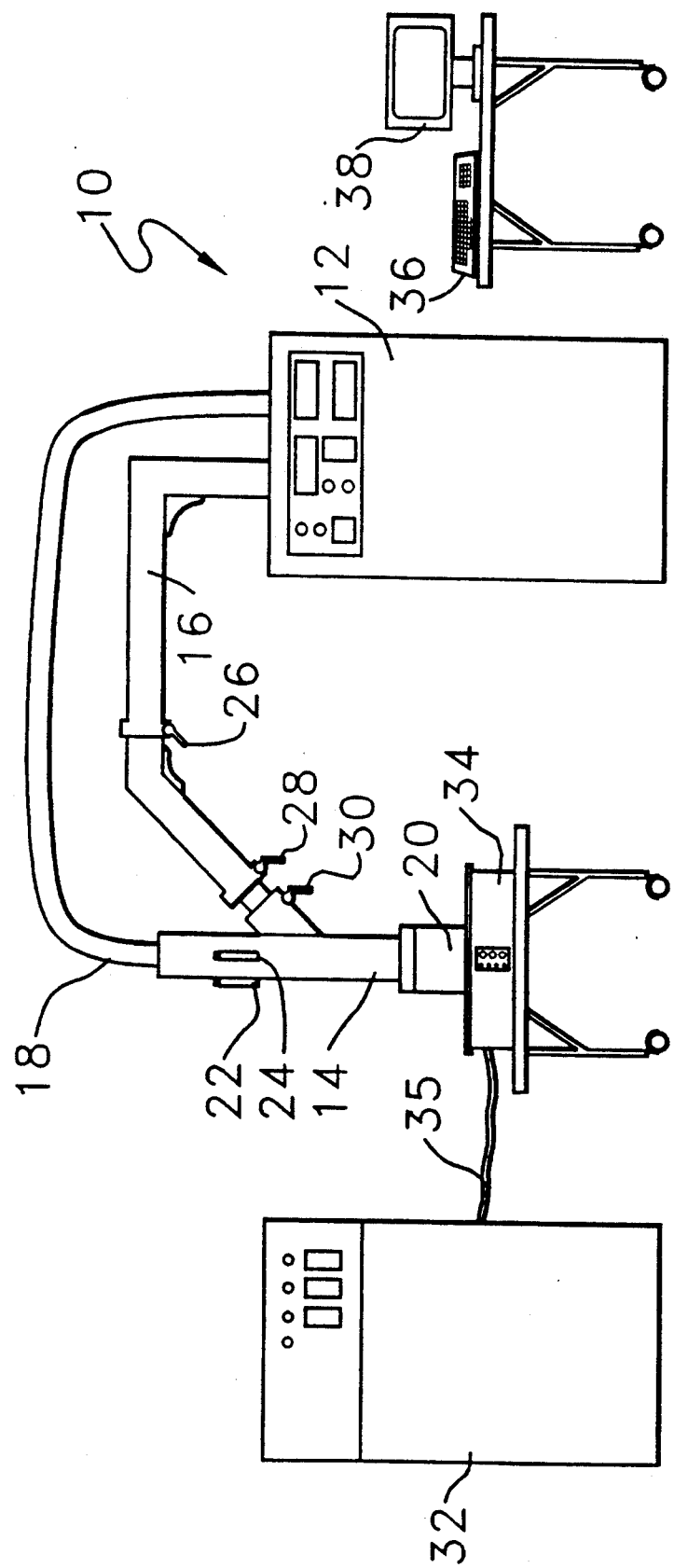
FIG. 4 is an elevational view of a temperature forcing unit positioned for testing.

Typically, temperature forcing unit 10 is used in conjunction with an integrated circuit testing system to temperature test a single device. FIG. 2 shows an integrated circuit testing system that includes a device tester 32, test head 34 and connecting cables 35. The integrated circuit testing system shown in FIG. 2 is an M-16 tester manufactured by Texas Instruments Incorporated. A keyboard 36 and a display terminal 38, also shown in FIG. 2, are typically connected to device tester 32. Device tester 32 has a variety of performance boards that can be selected for the testing of various devices. A device to be tested 40 is placed in an appropriate test socket 42 and the socket is mounted onto an appropriate performance board 44. Performance board 44 is attached to the top of test head 34, as shown in FIG. 3. Next, temperature control tube 14 is lowered around device 40 until it mates with the surface of performance board 44, as shown in FIG. 4. Fixture 20 usually includes a single device chamber 46, as shown in FIG. 5, having a single port outlet 48 that is coupled to temperature control tube 14. Single device chamber 46 closely surrounds the device to be tested to control the conditioned air flow. Since air flow is critical to successful temperature testing, an air tight seal is not desirable. Air must be allowed to flow past the device under test. This can be accomplished by allowing air to flow out from under single device chamber 46. If an air tight seal is created between fixture 20 and device test head 34, air must flow out from under single device chamber 46 and through exhaust ports 50 which vent the conditioned air to exhaust ports (not shown) on control tube 14. The device to be tested 40 is now ready for temperature testing.

Device tester 32 and control and temperature generation unit 12 respond to commands entered by an operator. In a production environment, there may be some interfacing between device tester 32 and control and temperature generation unit 12 in which a software program may generate commands for the entire procedure for a selected device.

Temperature forcing unit 10 and device tester 32 together effectively temperature test a device. While a temperature forcing unit 10 manufactured by Thermonics has been mentioned, similar temperature forcing units are available from other manufacturers, such as Temptronics and FTS. In each case, a temperature forcing unit is available that will provide a temperature controlled environment for a single device. And while an M-16 tester has been described, other testers are commercially available. But the use of a device tester having the ability to simultaneously test up to 8 devices is overkill when one is reminded that presently available temperature forcing units accommodate only one device at a time.

Various attempts have been made to place more than one device within single device fixture 20. The results have not been satisfactory. Even when the single device chamber 46 has been redesigned to accommodate more than one test device, there are constant problems with controlling the volume and direction of conditioned air flow over the multiple devices under test. Devices closer to the single air flow outlet reach the desired temperature more rapidly than devices spaced farther away from the air flow outlet. In some cases the more remote devices never reach the desired temperatures. In most cases, the temperatures amongst the devices are not uniform. Needless to say, these results are not satisfactory to the manufacturer or to the customer. What is needed is a device fixture used in conjunction with a standard temperature forcing unit which adequately provides direction and flow control of conditioned air to multiple devices under test.

Figure 6:
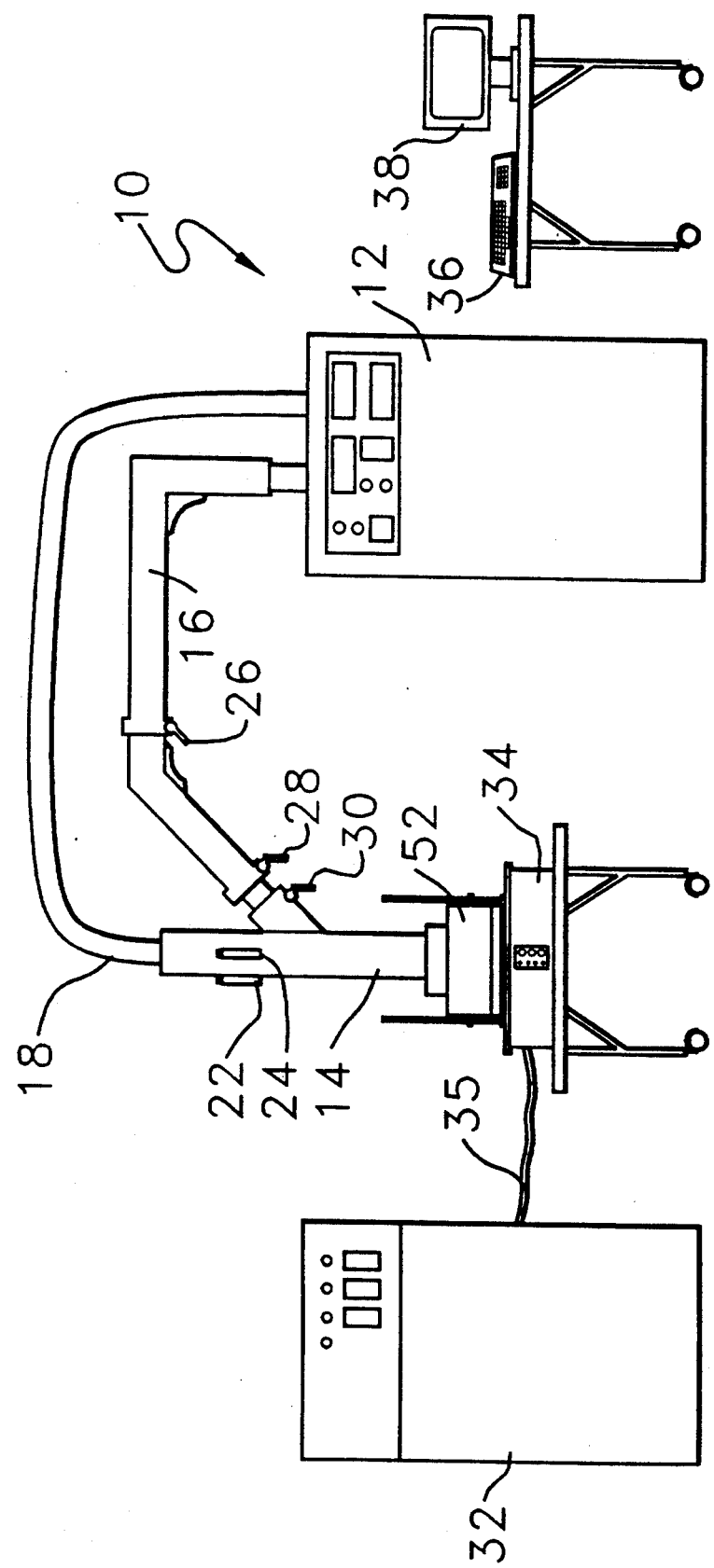
FIG. 6 is an elevation view of a temperature forcing unit having a multiple device fixture, according to one embodiment of the invention, secured to a temperature forcing unit and to a device tester.
Figure 7:
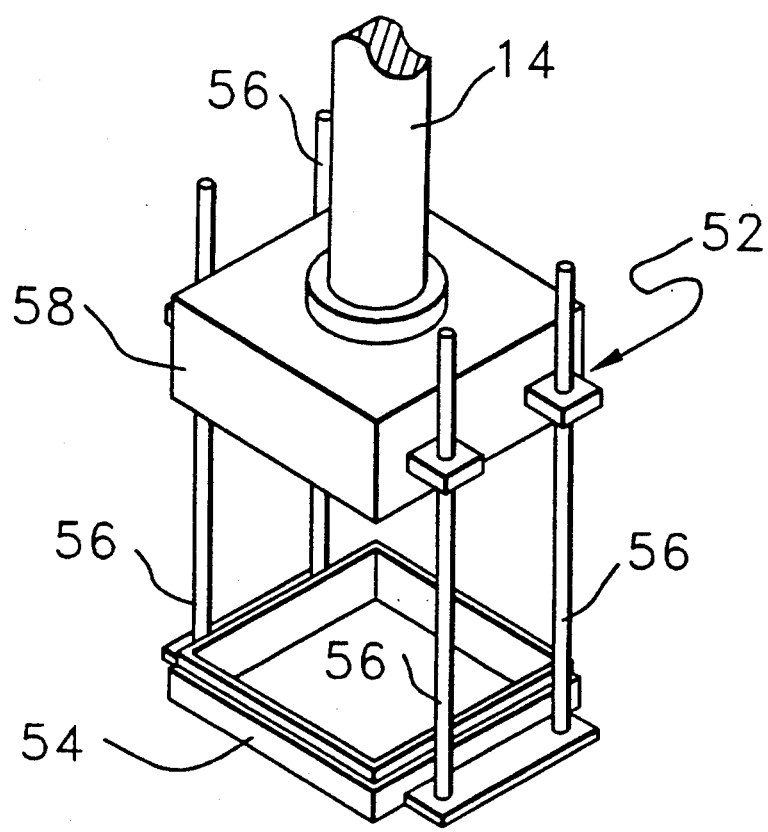
FIG. 7 is an elevational view of a multiple device fixture secured to a temperature control tube of a temperature forcing unit.
Figure 8:
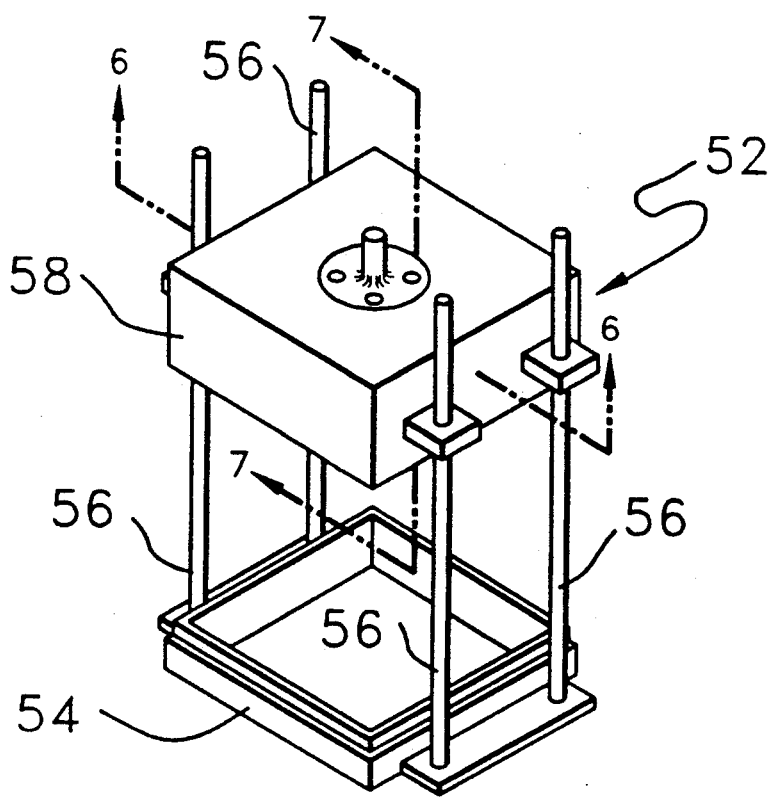
FIG. 8 is an elevational view of a multiple device fixture according to one embodiment of the invention.
Figure 9:
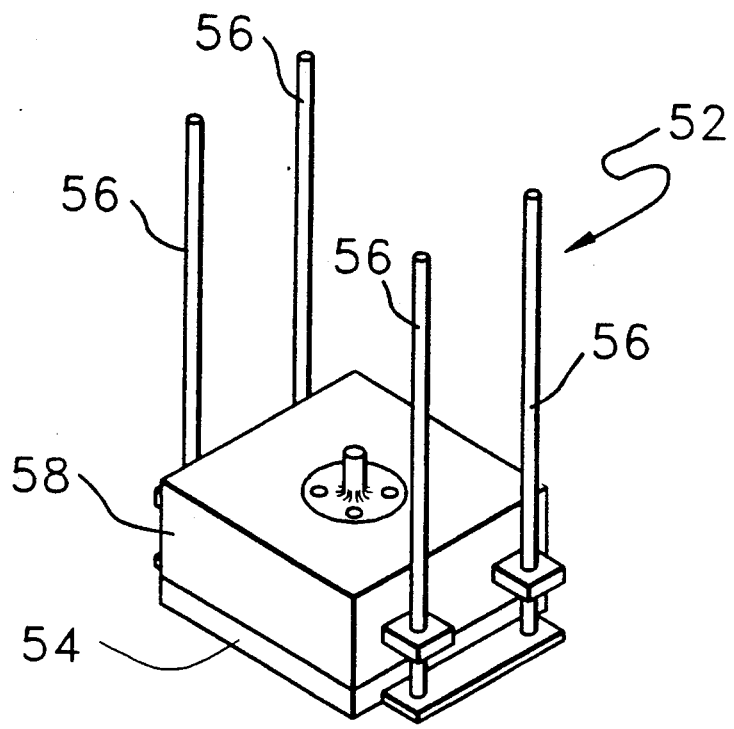
FIG. 9 is an elevational view of a multiple device fixture in a closed or mated position.

FIG. 6 shows a multiple device fixture 52 attached to temperature control tube 14 in lieu of single device fixture 20, according to a preferred embodiment of the invention. FIG. 7 shows an open multiple device fixture 52 attached to control tube 14. Multiple device fixture 52 includes a base 54, guide rails 56 and a lid 58. FIG. 8 shows multiple device fixture 52 by itself. In FIG. 9, lid 58 mates with base 54 to form a testing chamber within.

Multiple device fixture 52 should be constructed from a material or materials that can withstand the necessary temperature extremes while at the same time providing some insulative properties. A material manufactured by DuPont having the tradename "Delrin" may be used since it has excellent insulative properties and an ability to withstand a wide range of temperature extremes. Other materials having similar beneficial properties may also be used.

Figure 10:
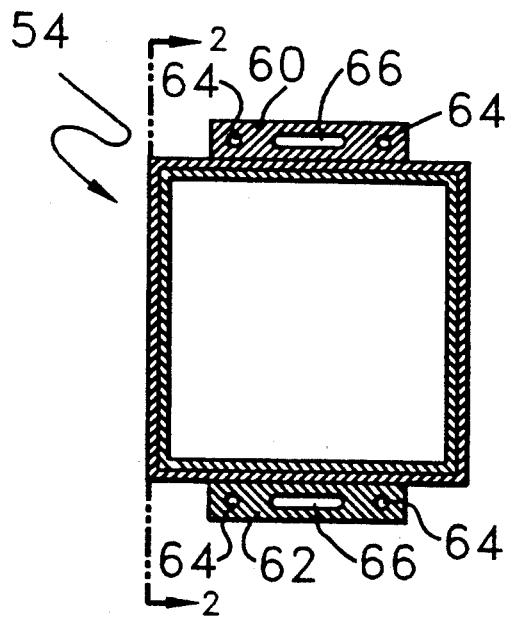
FIG. 10 is plan view of a multiple device fixture base.
Figure 11:
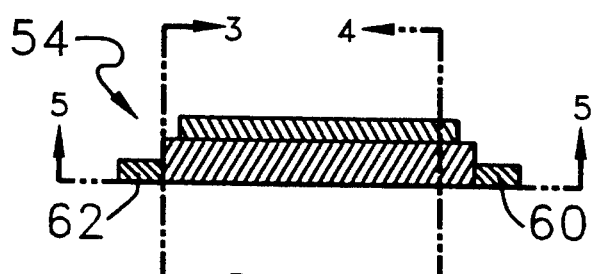
FIG. 11 is a partial sectional view of FIG. 10 taken along the section lines 2—2.
Figure 12:
FIG. 12 is a partial sectional view of FIG. 11 taken along the section lines 3—3, 4—4 and 5—5.

FIG. 10 shows a plan view of base 54. A pair of flanges, 60 and 62, are attached to opposite sides of base 54. Each flange has two holes 64, drilled and tapped, for guide rails 56 (not shown), and a hole 66 through which a fastener (not shown) may be inserted to secure base 54 to device test head 34. FIG. 11 shows a side sectional view of base 54 taken along the section lines 2—2 of FIG. 10. FIG. 12 shows a partial sectional view of base 54 taken along the section lines 3—3, 4—4 and 5—5 of FIG. 11. An optional base insert 70 is also shown in FIG. 12. While it is not necessary to have a base insert for the use of the multiple device fixture, a base insert can aid in controlling the escape of conditioned air around the bottom of base 54.

Figure 13:
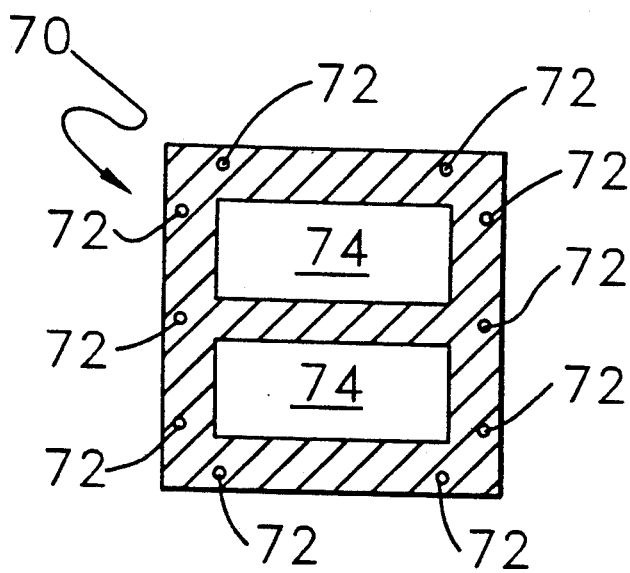
FIG. 13 is a plan view of a base insert.
Figure 14:
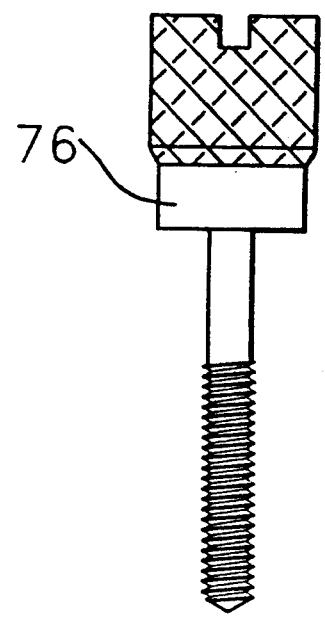
FIG. 14 is an elevational view of a thumbscrew.

FIG. 13 shows one possible embodiment of a base insert 70. Base insert 70 is dimensioned to fit within base 54. Base insert 70 includes mounting holes 72 and application holes 74 dimensioned to fit around the devices to be tested. Base insert 70 may be secured to base 54 with screws or small bolts (not shown) as required. FIG. 14 shows an elevational view of a thumbscrew 76. Thumbscrew 76 may be inserted through hole 66 of base 54, shown in FIG. 10, to secure base 54 to test head 34. In the embodiment of the invention shown in FIG. 10, two thumbscrews 76 are required to secure base 54 to test head 34.

Figure 15:
FIG. 15 is an elevational view of a coupling device.
Figure 16:
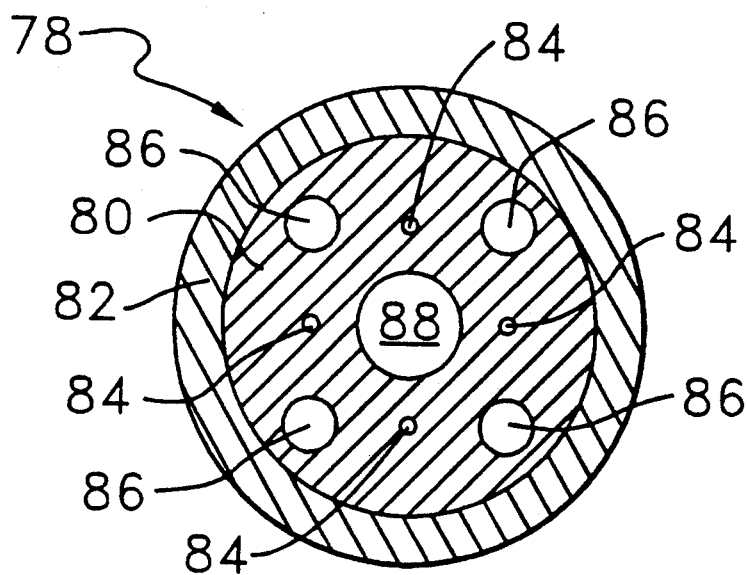
FIG. 16 is a plan view of a coupling device.

FIG. 15 shows an elevational view of a coupling device, shown generally at 78, that couples the temperature control tube 14 to lid 58. Coupling device 78 includes an upper disc surface 80 and a lower disc surface 82. The diameter of upper disc surface 80 is smaller than the diameter of lower disc surface 82. FIG. 16 shows a plan view of coupling device 78, including mounting holes 84, vent holes 86 and a support hole 88 that is dimensioned to accommodate an air input nozzle 100 (not shown). In a preferred embodiment of the invention, coupling device 78 is made out of aluminum for ease of construction.

Figure 17:
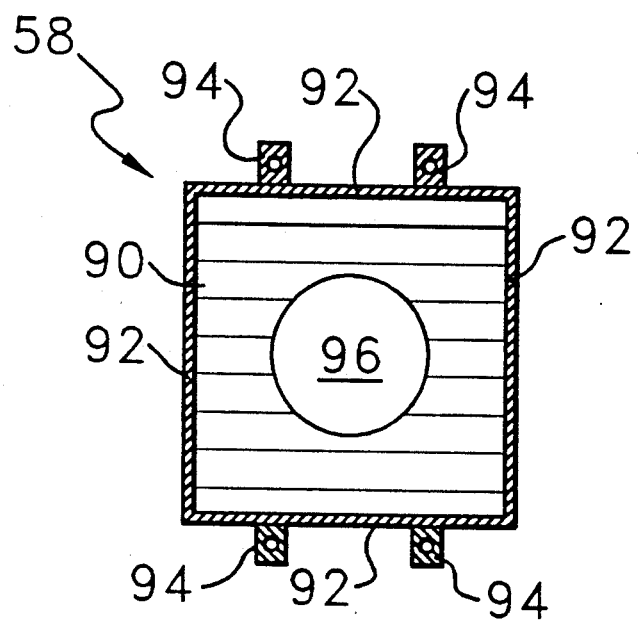
FIG. 17 is a top plan view of the multiple device fixture lid.
Figure 18:
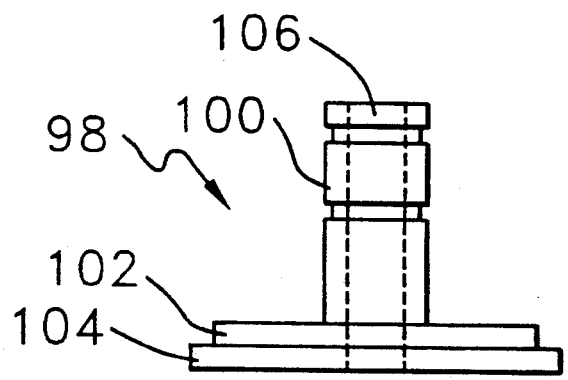
FIG. 18 is an elevational view of an air input coupling device.
Figure 19:
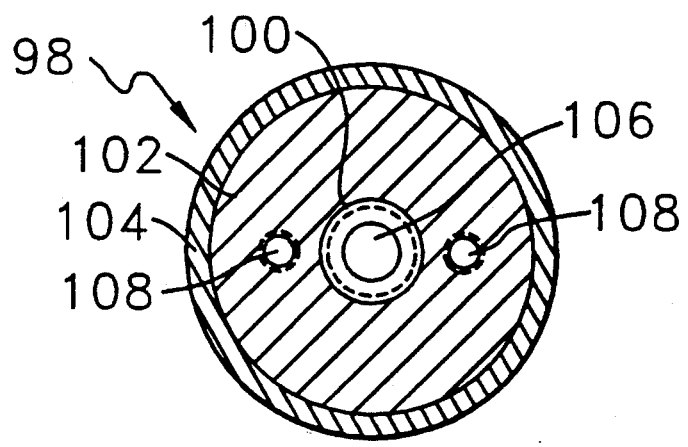
FIG. 19 is a plan view of an air input coupling device.

FIG. 17 shows a top plan view of lid 58. Lid 58 includes a top surface 90, sidewalls 92 and guide rail guides 94. Top surface 90 includes a hole 96 dimensioned to accommodate upper disc surface 80 of coupling device 78. FIG. 18 shows an air input coupling device 98 having an air input nozzle 100, an upper interface plate 102 and a lower interface plate 104 with upper interface plate 102 having a smaller diameter than lower interface plate 104. A hole 106 is drilled or formed the length of air input coupling device 98. Hole 106 allows air to flow from temperature control tube 14 to lid 58. FIG. 19 shows a plan view of air input coupling device 98, including mounting holes 108. In a preferred embodiment of the invention, air input coupling device 98 is also made out of aluminum for ease of construction and the fact that aluminum can withstand higher temperatures than Delrin can.

Figure 20:
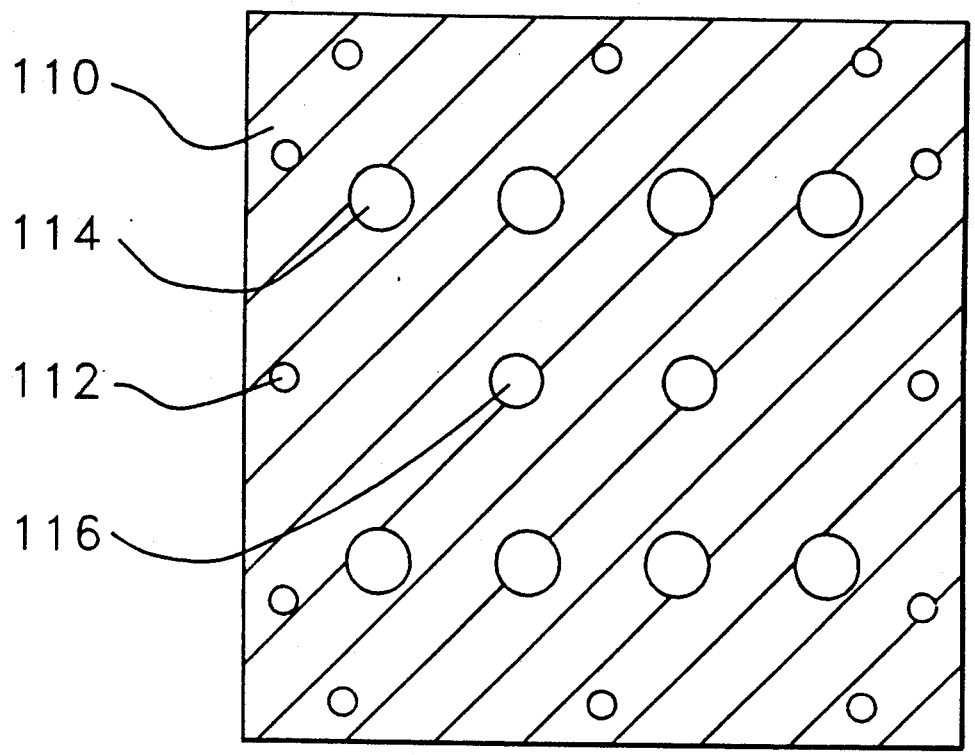
FIG. 20 is a top plan view of a lid insert.
Figure 21:
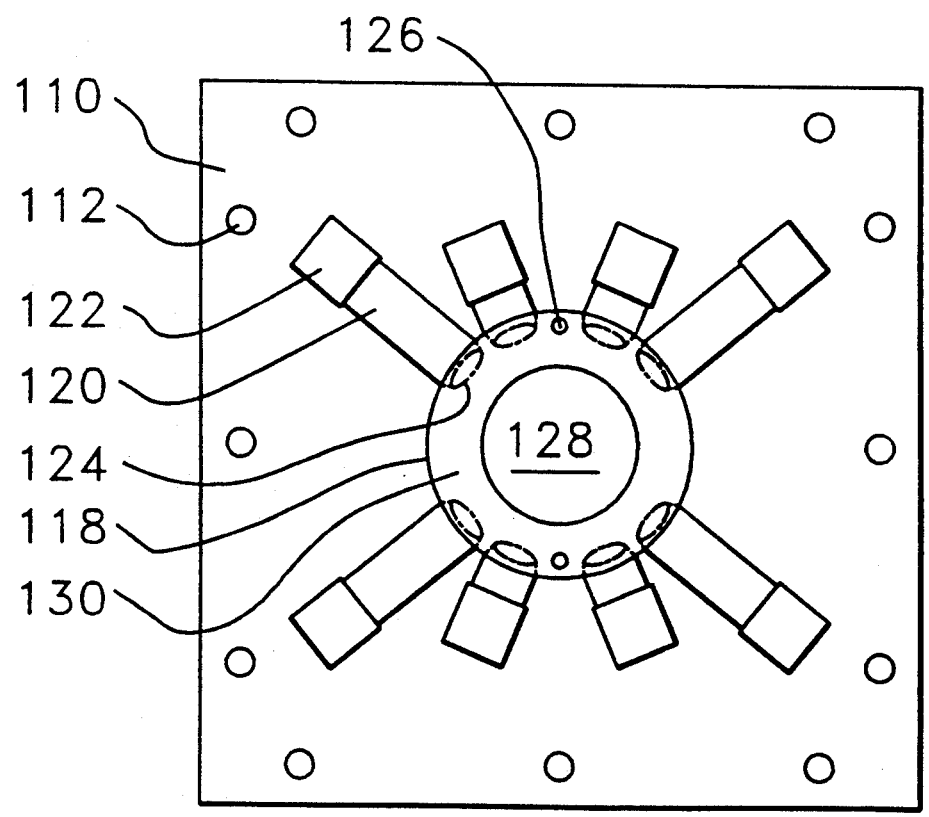
FIG. 21 is a top plan view of a lid insert including an air manifold, air tubes and threaded elbows.

FIG. 20 shows a top plan view of a lid insert 110 including mounting holes 112, air nozzle holes 114 and access holes 116. While eight air nozzle holes 114 in straight rows and columns are shown in FIG. 20, lid insert 110 may include as many air nozzle holes in as many configurations as needed. FIG. 21 is a top plan view of lid insert 110, including air manifold 118, air tubes 120 and threaded elbows 122. Air manifold 118 should have as many threaded holes 124 as necessary to accommodated the required air tubes 120. In a preferred embodiment of the invention, there are eight threaded holes 124. Air manifold 118 also includes two mounting holes 126. Screws or bolts are passed through holes 126 of air manifold 118 to mounting holes 108 of air input coupling device 98 to secure air manifold 118 to air input coupling device 98.

Figure 22:
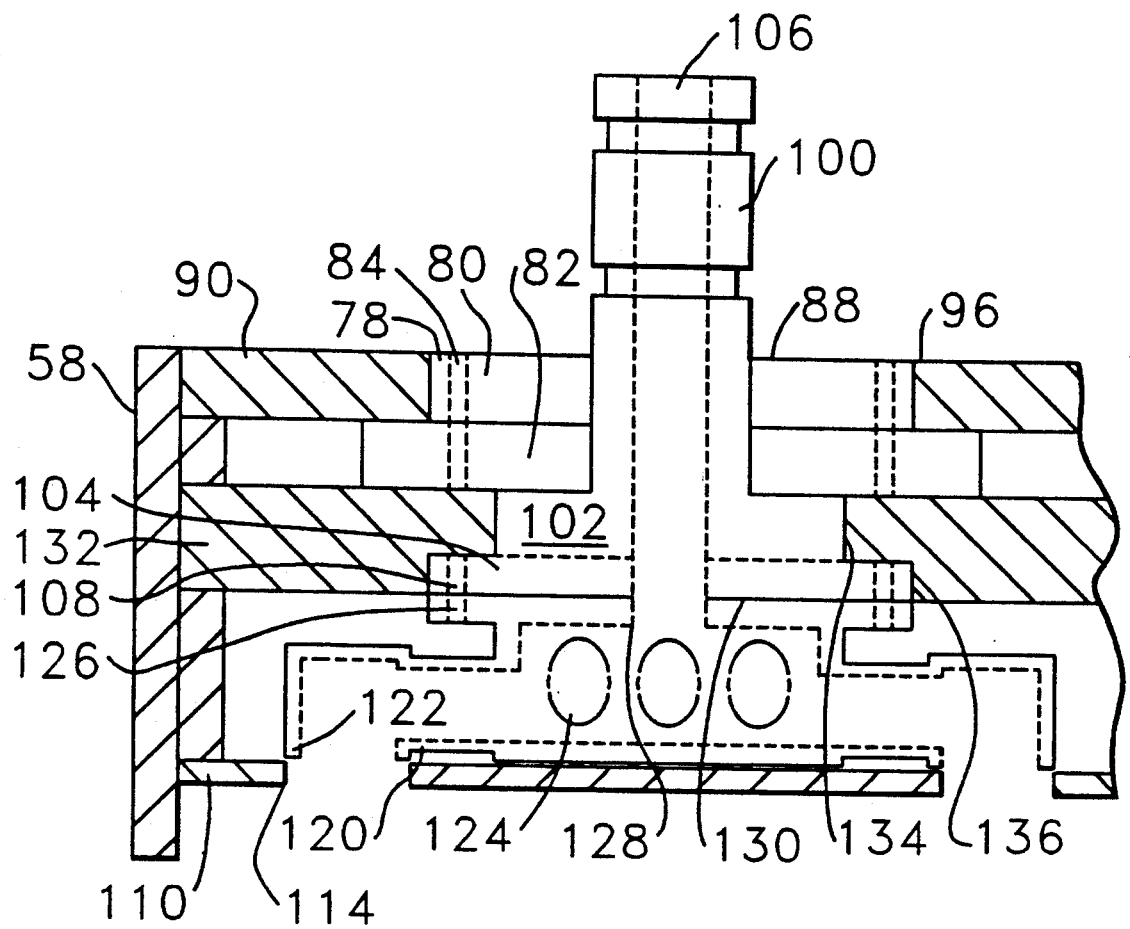
FIG. 22 is a partial sectional view taken along the section lines 6—6 and 7—7 of FIG. 8 (without air nozzles).

FIG. 22 shows an enlarged sectional view of FIG. 8 taken along the section lines 6—6 and 7—7 (without air nozzles). Upper disc surface 80 of coupling device 78 is positioned within hole 96 of top plate 90 with lower disc surface 82 abutting the inside of top plate 90. Coupling device 78 should be rotatable within hole 96. Next, coupling device 78 is secured to temperature control tube 14 with screws or bolts (not shown) through mounting holes 84. Since coupling device 78 also supports lid 58, lid 58 is rotatably attached to control tube 14.

A secondary surface layer 132, having both a support hole 134 that accommodates air input nozzle 100 of air input coupling device 98 and a recessed area 136 that accommodates lower interface plate 104, is positioned under lower disc surface 82. Next, air input nozzle 100 of air input coupling device 98 is inserted through support hole 134 of secondary surface layer 132 and through support hole 88 of coupling device 78 and into the air flow cavity (not shown) of control tube 14. Lower disc interface plate 104 of air input coupling device 98 is secured to interface surface 130 of air manifold 118 with screws or bolts (not shown) through mounting holes 108 of air input coupling device 98 and mounting holes 126 of air manifold 118. Lid insert 110 is then secured with screws or bolts (not shown) to the inside of lid 58. The vacant space between lid insert 110 and the top surface 90 of lid 58 may optionally be filled with an insulative material.

Figure 23:
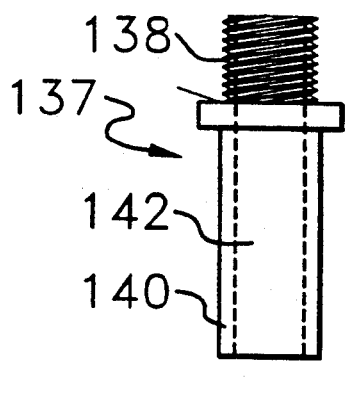
FIG. 23 is an enlarged elevational view of an air nozzle.
Figure 24:
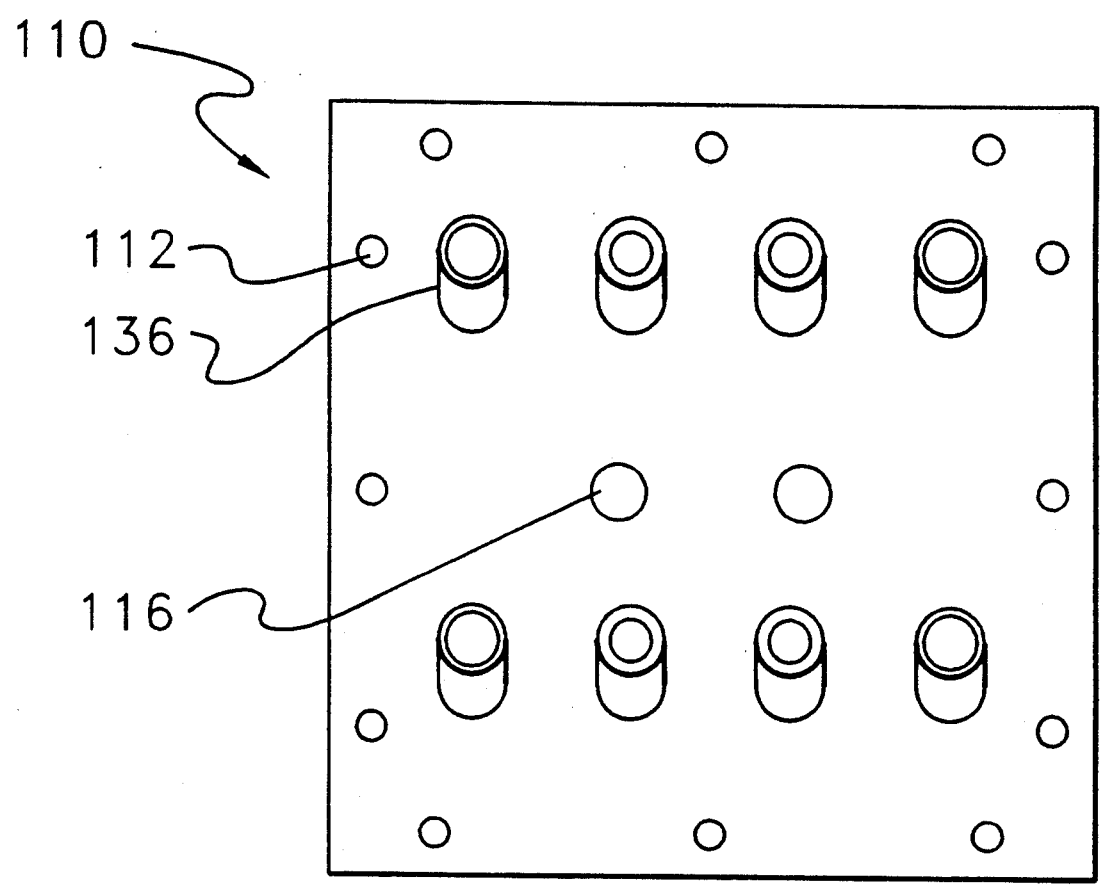
FIG. 24 is a bottom plan view of a lid insert including air nozzles.

FIG. 23 shows an air nozzle 137 having a threaded end 138 and an output end 140. A hollow passageway 142 is formed from threaded end 138 to output end 140. FIG. 24 shows a bottom plan view of lid insert 110. In the embodiment of the invention shown in FIG. 24, eight air nozzles 136 are secured to respective threaded elbows 122. The diameter of hollow passageway 142 of the outer air nozzles 136 is larger than the diameter of the inner air nozzles 136 to equalize air flow. As an alternative to various hollow passageway diameters, all hollow passageway diameters can be the same if individually controlled regulators (not shown) are used in conjunction with each air nozzle.

The length of each air nozzle is selected so that its output end is as close to the device under test as possible without restricting air flow. Thus, devices of different sizes will require air nozzles of different lengths.

Figure 25:
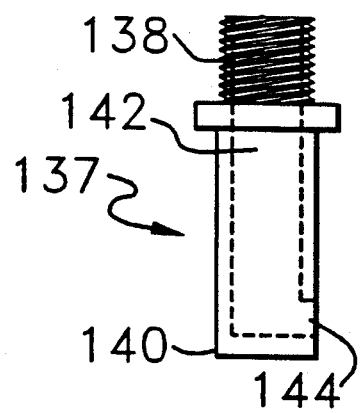
FIG. 25 is an enlarged elevational view of an air nozzle according to another embodiment of the invention.

Certain package types exist that have a vertical rather than a horizontal orientation. For the testing of these vertical packages, air nozzle 136 must be modified to direct conditioned air onto the vertical package. As shown in FIG. 25, air nozzle 136 has a threaded end 138 an output end 140 and a hollow passageway 142 that is formed from threaded end 138 vertically until it intersects a horizontal output port 144 that exits the side of air nozzle 136. Both the length of the air nozzle and the positioning of the horizontal output port is dependent upon the size and location of the device to be tested.

Figure 26:
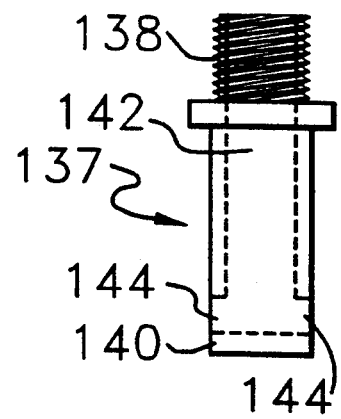
FIG. 26 is an enlarged elevational view of an air nozzle according to yet another embodiment of the invention.

In another embodiment of the invention, shown in FIG. 26, horizontal output ports 144 exit out opposite sides of air nozzle 136 to direct condition air onto two devices simultaneously.

While specific embodiments of the present invention are disclosed herein, they are not to be construed in a limiting sense. For example, the multiple device fixture can be modified to fit just about any temperature forcing unit. And while the multiple device fixture has been described having a base, guide rails and a lid, an alternative embodiment of the multiple device fixture may do away with the base if a mechanism is used that properly aligns and seats the multiple device fixture over the devices to be tested. Repeatability of alignment and seating is required for a multiple device fixture not having a base.

The physical size of the multiple device fixture can be expanded or altered, depending upon the number and sizes of the devices to be tested, and is limited only by the constraints of the temperature forcing unit. While the embodiments thus described show up to eight air nozzles, there is no reason why this number cannot be expanded. Air manifolds and lid inserts can be custom designed to accommodate a variety in the number and location of air nozzles. If by chance there are unnecessary air nozzles in a particular application, the unused air nozzles can be plugged at the nozzle or removed and plugs inserted at the threaded elbow. And while the multiple device fixture has been described being used with a device tester, the multiple device fixture may also be used in bench testing of devices. It is therefore contemplated that the appended claims will cover any such modifications or embodiments as fall within the true scope of the invention.

We claim:

1. A device, comprising:
   a temperature forcing unit;
   a fixture, including a base and a lid, coupled to said temperature forcing unit, said fixture accurately distributes conditioned air from said temperature forcing unit to multiple locations simultaneously; and
   flanges connected to said base, guiderails connected to said flanges and guiderail guides connected to said lid.

2. A device according to claim 1, wherein said guiderails pass through said guiderail guides and said lid is slidably adjustable from an open position above said base to a closed position wherein said lid abuts said base.

3. A device, comprising:
   a temperature forcing unit;
   a fixture, including a base and a lid, coupled to said temperature forcing unit, said fixture accurately distributes conditioned air from said temperature forcing unit to multiple locations simultaneously; and
   a base insert connected to said base, said base insert having holes to accommodate multiple electronic devices.

4. A device, comprising:
   a temperature forcing unit;
   a coupling device; and
   a fixture, including a base and a lid, said coupling device coupling said fixture to said temperature forcing unit, said fixture accurately distributes conditioned air from said temperature forcing unit to multiple locations simultaneously.

5. A device according to claim 4, wherein said coupling device includes an upper disc surface and a lower disc surface, said upper disc surface having a smaller diameter than said lower disc surface.

6. A device, comprising:
   a temperature forcing unit;
   a fixture, including a base and a lid, coupled to said temperature forcing unit, said fixture accurately distributes conditioned air from said temperature forcing unit to multiple locations simultaneously; and
   an air input coupling device having an air shaft for conducting conditioned air from said temperature forcing unit to said lid, said air input coupling device includes an air input nozzle, an upper interface plate and a lower interface plate with said upper interface plate having a smaller diameter than said lower interface plate.

7. A device, comprising:
   a temperature forcing unit;
   a fixture, including a base and a lid, coupled to said temperature forcing unit, said fixture accurately distributes conditioned air from said temperature forcing unit to multiple locations simultaneously;
   an air input coupling device having an air shaft for conducting conditioned air from said temperature forcing unit to said lid, and
   a lid insert having air holes, said lid insert connected to said lid.

8. A device, comprising:
   a temperature forcing unit;
   a fixture, including a base and a lid, coupled to said temperature forcing unit, said fixture accurately distributes conditioned air from said temperature forcing unit to multiple locations simultaneously;
   an air input coupling device having an air shaft for conducting conditioned air from said temperature forcing unit to said lid, and
   an air manifold coupled to said air input coupling device, said air manifold having multiple air output ports.

9. A device according to claim 8, including air tubes coupling air nozzles to said air manifold.

10. A device according to claim 9, wherein said air nozzles have vertical output ports.

11. A device according to claim 9, wherein said air nozzles each have at least one horizontal output port.

12. A device, comprising:
    a temperature forcing unit;
    a fixture rotatably connected to said temperature forcing unit for accurately distributing conditioned gas from said temperature forcing unit to multiple locations simultaneously, said fixture including a manifold having an input port coupled to said temperature forcing unit and multiple output ports coupled to nozzles.

13. A device according to claim 12 including tubes coupling said nozzles to said output ports.

14. A device according to claim 12 wherein each of said multiple locations contains an electronic device.

15. A device according to claim 12 wherein said fixture includes a lid and a base.

16. A device according to claim 15 wherein said lid is slidably connected to said base.

17. A device according to claim 15 further including means for adjustably connecting said base to said lid.

* * * * *